(12) United States Patent
Genis et al.

(10) Patent No.: US 8,048,223 B2
(45) Date of Patent: Nov. 1, 2011

(54) GROWN DIAMOND MOSAIC SEPARATION

(75) Inventors: Alfred Genis, East Douglas, MA (US); Robert C. Linares, Sherborn, MA (US); Patrick J. Doering, Holliston, MA (US)

(73) Assignee: Apollo Diamond, Inc., Framingham, MA (US)

( * ) Notice: Subject to any disclaimer, the term of this patent is extended or adjusted under 35 U.S.C. 154(b) by 209 days.

(21) Appl. No.: 11/186,421

(22) Filed: Jul. 21, 2005

(65) Prior Publication Data
US 2007/0017437 A1    Jan. 25, 2007

(51) Int. Cl.
*C30B 29/02* (2006.01)

(52) U.S. Cl. ............ 117/89; 117/104; 117/105; 117/90; 117/929

(58) Field of Classification Search ............ 117/89, 117/94, 95, 915, 917, 929, 90, 104, 105; 423/446
See application file for complete search history.

(56) References Cited

U.S. PATENT DOCUMENTS

| 6,582,513 | B1 | 6/2003 | Linares et al. | |
| 6,589,333 | B1 * | 7/2003 | Gosele et al. | 117/84 |

FOREIGN PATENT DOCUMENTS

WO    WO-2007014032 A1    2/2007

OTHER PUBLICATIONS

"International Search Report and Written Opinion for Application No. PCT/US2006/028361, Mailed Nov. 30, 2006", 11 Pages.
"Layer splitting process in hydrogen-implanted Si, Ge, SiC, and diamond substrates", *Applied Physics Letters, AIP, American Institute of Physics*: 70 (11), (March 17, 1997), 1390-1392.
Hunn, J. D., et al., "The Separation of Thin Single Crystal Films From Bulk Diamond by MEV Implantation", *Nuclear Instruments & Methods in Physics Research*; 99, (1995), 602-605.
Janssen, G., et al., "'Mosaic' growth of diamond", *Diamond and Related Materials, Elsevier Science Publishers*; 4 (7), (May 15, 1995), 1025-1031.
Parikh, N. R., "Single-Crystal Diamond Plate Liftoff Achieved by Ion Implantation and Subsequent Annealing", *Applied Physics Letters, AIP, American Institute of Physics*; 61 (26), (Dec. 28, 1992), 3124-3126.
"European Application No. 06788102.9, Office Action Mailed Dec. 15, 2008".
"European Application Serial No. 06788102.9, Office Action mailed Mar. 7, 2011", 7 pgs.
Hunn, J. D, et al., "The separation of thin single crystal films from bulk diamond by MeV implantation", Nuclear Instruments and Methods in Physics Research Section B: Beam Interactions with Materials and Atoms, 99(1-4), (May 5, 1995), 602-605.
Parikh, N R, et al., "Single-crystal diamond plate liftoff achieved by ion implantation and subsequent annealing", Applied Physics Letters, 61, (1992), 3124-3126.
Tong, Q. Y, et al., "Layer splitting process in hydrogen-implanted Si, Ge, SiC, and diamond substrates", Applied Physics Letters, 70 (1997), 1390-1392.

* cited by examiner

*Primary Examiner* — Robert M Kunemund
(74) *Attorney, Agent, or Firm* — Schwegman, Lundberg & Woessner, P.A.

(57) ABSTRACT

The present invention provides in one example embodiment a synthetic diamond and a method of growing such a diamond on a plurality of seed diamonds, implanting the grown diamond with ions, and separating the grown diamond from the plurality of seed diamonds.

36 Claims, 3 Drawing Sheets

GROWN DIAMOND MOSAIC SEPARATION

PRIORITY CLAIM AND NOTICE OF COPENDING APPLICATION

This application claims priority to U.S. patent application Ser. No. 11/056,338, filed Feb. 11, 2005, titled "Diamond Structure Separation", and to U.S. patent application Ser. No. 11/043,684, filed Jan. 26, 2005, titled "Boron-Doped Diamond Semiconductor", which are incorporated herein by reference.

FIELD OF THE INVENTION

The invention relates generally to diamond fabrication, and more specifically to separating layers of a mosaic-grown diamond.

BACKGROUND OF THE INVENTION

Diamond is among the most useful materials presently known, with hardness, thermal conductivity, and other properties that distinguish it from other materials. A diamond's hardness makes it well suited for use in cutting or grinding tools, such as use in saw blades, drill bits, or as an abrasive for polishing or grinding. Other uses for diamond include use in high-performance bearings, and in special purpose windows such as for aircraft mounted laser devices.

Diamonds are also well-known for their light dispersion and for their appearance, and are among the most desired elements used in creating jewelry. The scattering of light from a well-cut diamond distinguishes its appearance from other transparent or semitransparent crystals, making it visually more attractive. A diamond's hardness makes it resistant to scratching or other damage, making it among the most durable and practical jewelry materials for everyday wear.

Diamonds are also naturally insulators, but can be semiconductors when doped with certain impurities such as boron, which creates p-type diamond having a surplus of "holes", or an absence of electrons, because boron has only three valence electrons which is one fewer than carbon. The thermal conductivity of diamond due to the strong covalent bonds with in the diamond structure also make it useful as a heat conductor, such as to conduct heat away from an integrated circuit or other semiconductor device.

But, diamond is difficult to find and is typically found in fairly small sizes in nature. Many of the applications described above illustrate potential uses for large, high-quality diamonds, were such diamonds to become commercially available. Larger jewels, larger semiconductor substrates, larger windows, and larger diamond elements on cutting tools are all desirable, and illustrate the need for large diamonds.

SUMMARY

The present invention provides in one example embodiment a synthetic diamond and a method of growing such a diamond on a plurality of seed diamonds, implanting the grown diamond with ions, and separating the grown diamond from the plurality of seed diamonds. In various further embodiments, the diamond is grown via chemical vapor deposition, the implanted ions comprise hydrogen ions, and the grown diamond is separated from the seed diamonds through application of heat after ion implantation.

DETAILED DESCRIPTION

In the following detailed description of example embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the substance or scope of the present invention. The following detailed description is, therefore, not to be taken in a limiting sense, and the scope of the invention is defined only by the appended claims.

One example of the invention provides a synthetic diamond and a method of growing such a diamond on a plurality of seed diamonds, implanting the grown diamond with ions, and separating the grown diamond from the plurality of seed diamonds. In various further embodiments, the diamond is grown via chemical vapor deposition, the implanted ions comprise hydrogen ions, and the grown diamond is separated from the seed diamonds through application of heat after ion implantation.

The resulting diamond will therefore in some embodiments have a first ion implanted surface substantially parallel to the second surface, which is at a depth from the first surface determined by the energy of the ion implantation. The second surface will therefore also likely have an ion density significantly greater than that of the first surface or than that of the bulk or body of the diamond.

FIGS. 1-5 illustrate a method of creating a monocrystalline synthetic diamond by growing the diamond on a plurality of seed diamonds and separating the grown diamond from the seed diamonds using ion implantation.

Figure 1:
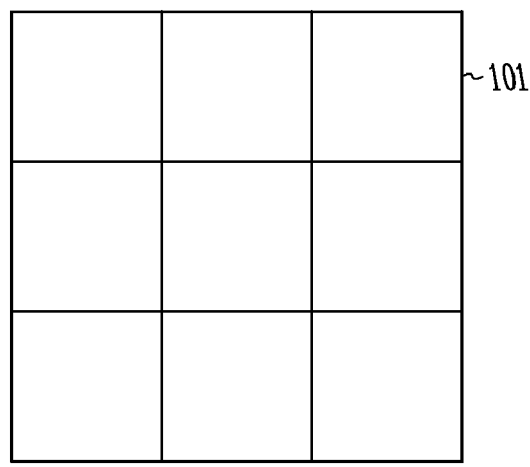
FIG. 1 shows a top view of a mosaic of diamond seed crystals, as may be used to practice some example embodiments of the invention.

FIG. 1 is a top view of an example assembly of seed diamonds 101, which are to be used as a base for growing the synthetic diamond. The seed diamonds are natural or synthetic diamonds in various embodiments, and in this example are arranged to form a substantially flat growing surface upon which the synthetic diamond can be grown. The seed diamonds are arranged in different configurations, having different shapes, sizes, and crystal structure planes oriented in different directions in various embodiments.

Figure 2:
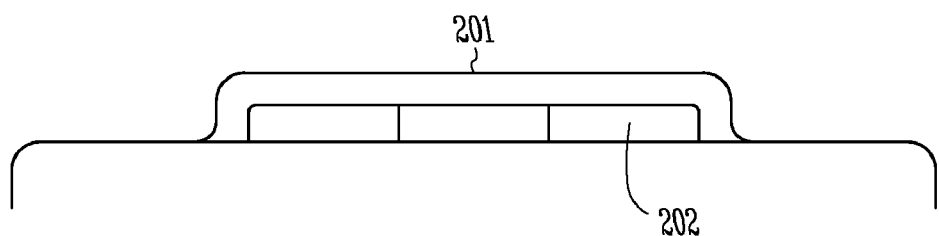
FIG. 2 shows a synthetic grown monocrystalline diamond grown on a mosaic of seed diamonds, consistent with some example embodiments of the invention.

The mosaic of diamonds assembled in FIG. 1 is then used as a seed or growing surface for formation of a diamond in FIG. 2. The synthetic grown diamond 201 is formed in some embodiments by chemical vapor deposition, or by other means such as high pressure high temperature growth. The diamond 201 forms across the seed crystal diamonds 202, and in some embodiments forms a diamond that is substantially larger than any of the individual seed crystals upon which it is grown. The synthetic grown diamond 201 is in some example embodiments a monocrystalline diamond, such that its crystal structure is essentially consistent throughout the grown diamond.

This process can result in creation of a synthetic grown diamond that is significantly larger than any of the seed diamonds in at least one or two dimensions. In the examples of FIGS. 1 and 2, the grown synthetic diamond is as large in the plane shown in FIG. 1 as nine of the seed diamonds, resulting in a grown diamond that is much larger than diamonds that can be created by other known methods. But, the grown diamond is attached to multiple seed diamonds, and growth of very large diamonds would appear to require use of a very large number of seed diamonds without a means of separating the grown synthetic diamond from the seed diamonds as is illustrated in FIGS. 3-5.

Figure 3:
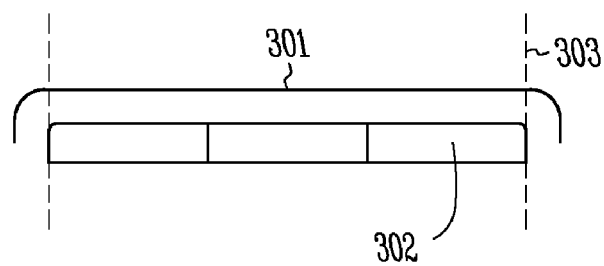
FIG. 3 shows the trim regions of a grown synthetic diamond and seed diamond assembly, consistent with some example embodiments of the invention.

FIG. 3 shows the grown synthetic diamond 301 formed on the seed diamonds 302, along with dashed lines indicating a cutting path configured to produce a synthetic diamond with a relatively flat exposed surface. The diamond can be cut using various technologies such as lasers, diamond saws, by applying force along a crystal plane of the diamond, or by other such methods. The top surface of the diamond is in some examples polished or ground flat, so that the top surface of the synthetic grown diamond is sufficiently flat for the intended purpose, such as for a diamond window, a semiconductor substrate or element, for cutting tools, or for producing gemstones.

Figure 4:
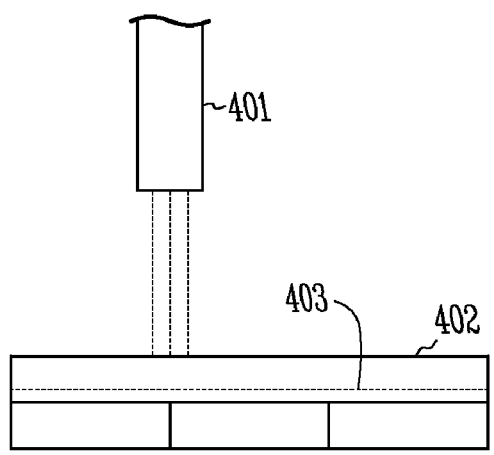
FIG. 4 shows ion implantation into a grown synthetic diamond and seed diamond assembly, consistent with some example embodiments of the invention.

Once the top surface is sufficiently flat, ions such as hydrogen are implanted as shown in FIG. 4. The ion implantation device 401 implants ions with an energy designed to penetrate the synthetic grown diamond 402 to a specific, desired depth at which the grown synthetic diamond will be separated from the diamond below, including the seed crystals. Once the hydrogen ions are implanted at the desired depth to form a layer 403 having a relatively high ion concentration, the diamond assembly of FIG. 4 is heated until it separates at the ion implantation layer. In some further embodiments, other stimulus such as physical pressure, light, or other changes can be used to separate the diamond at the layer of ion implantation, resulting in the separated diamond assembly as shown in FIG. 5.

Figure 5:
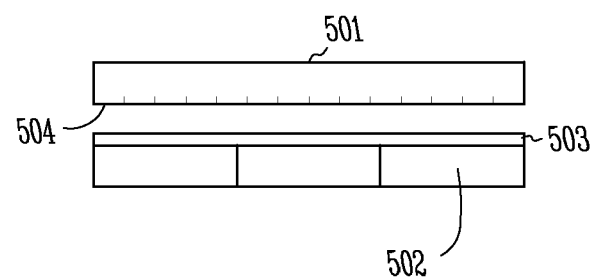
FIG. 5 shows separation of the grown synthetic diamond and seed diamond assembly at the level of ion implantation by using heat, consistent with some example embodiments of the invention.

Looking more closely at FIG. 5, the synthetic grown diamond layer 501 is separated from the seed crystals 502 such that a thin layer of grown diamond 503 remains on the seed crystals, resulting in a relatively smooth separation surface at the ion implantation level. The newly exposed surface of the synthetic grown diamond 504 in this example therefore is relatively similar in shape or contour to the shape of the top surface during ion implantation as was shown in FIG. 4, and has a higher than typical ion concentration at or very near the newly exposed separated surface.

The method described here can be repeated multiple times, such as to create ever-larger grown synthetic diamonds to use as seed crystals for even larger synthetic grown diamonds, or by repeatedly lifting off layers of grown diamond from the same mosaic assembly of seed crystals. For example, the single monocrystalline grown synthetic diamond 501 of FIG. 5 separated from the seed diamond mosaic 101 of FIG. 1 can itself serve as a seed diamond in a mosaic similar to that of FIG. 1, providing a seed diamond mosaic that will produce a grown synthetic diamond 81 times the area of the individual seed diamonds shown in FIG. 1. Repetition of this process can result in diamonds that are very large, such as diamond substrates suitable for supporting large integrated circuits such as high-performance microprocessors or digital signal processors. Large diamond windows for applications such as military laser devices are also made possible by repeated use of the mosaic tiling and ion implantation liftoff process, along with a variety of other large diamond structures for other applications not previously practical to manufacture.

Revisiting FIG. 5, the hydrogen ion implantation left a layer of monocrystalline diamond 503 behind on the mosaic tile of seed diamonds after heat separation or liftoff of the grown synthetic diamond 501. If the grown synthetic diamond is made significantly thicker than needed to produce the desired grown synthetic diamond 501, multiple ion implant and liftoff cycles can be performed on the same grown diamond. Also, the mosaic of seed diamonds having a layer of monocrystalline synthetic grown diamond 503 can be polished or used as it is to serve as a seed for production of additional diamonds by growing additional synthetic diamond on the remaining diamond structure formed by seed diamonds 502 and grown diamond 503.

Figure 6:
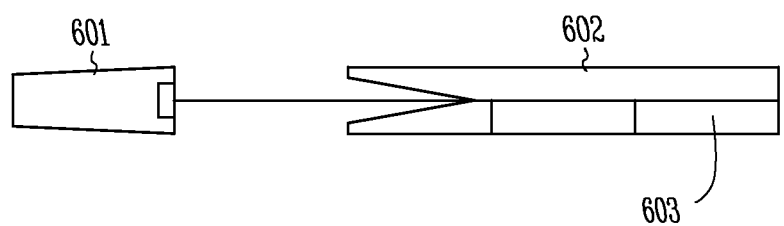
FIG. 6 illustrates separation of the grown synthetic diamond and seed diamond assembly with a laser, consistent with some example embodiments of the invention.

Other technologies for separating diamond include use of cutting tools and use of lasers, such as is shown in FIG. 6. Here, the laser 601 cuts a wedge-shaped gap between the grown diamond 602 and the diamond seeds 603, resulting in destruction of a significant amount of diamond mass. As the laser proceeds through the diamond, it continues to destroy more diamond such that the amount of diamond seed remaining and the size of the grown diamond are substantially reduced, making this process undesirable due to the relative inefficiency and waste it produces. With a convergence angle of two to six degrees, the deep cuts into diamond material result in an increased depth of desirable diamond removed from the grown and seed diamond structures. This can amount to a loss of ten carats in a one-square inch diamond.

Similarly, mechanical cutting tools such as diamond saws cut by grinding diamond away, resulting in destruction of a significant amount of diamond near the mosaic seed diamond—synthetic grown diamond interface. The depth of the cut required for either a laser or mechanical cutting tool further make use of such technologies undesirable due to the difficulty of controlling a cut deep within a cut diamond cavity.

Although this example uses chemical vapor deposition to form the grown synthetic diamond, various technologies can be employed for diamond formation in other examples, including microwave plasma reactors, DC plasma reactors, RF plasma reactors, hot filament reactors, and other such technologies. The formation of synthetic diamond can be achieved through a variety of methods and apparatus, such as that described in U.S. Pat. No. 6,582,513, titled "System and Method for Producing Synthetic Diamond", which is incorporated by reference.

The diamond grown in one example is a monocrystalline synthetic diamond uses a stream of gas, such as methane or other gas, to provide the precursor material for the plasma reactor to produce a plasma that precipitates to form diamond. The gas in some examples or in some layers of the diamond contains various impurities, such as boron dopants or various isotopes of carbon. For example, diamonds having a greater than average purity of carbon-12 and a corresponding reduced concentration of carbon-13 isotopes are known as isotopically enhanced, and are particularly thermally conductive. This makes them well-suited for applications such as semiconductor device fabrication, enabling higher power and higher density than can otherwise be achieved. Isotopic enhancement of the diamond CVD precursor gases with carbon-12 can result in a diamond having significantly less than the typical 1.1% carbon-13 concentration, resulting in thermal conductivity as high as 3300 W/mK. Other examples of methods of producing synthetic diamond with high thermal conductivity include growing diamond in a low nitrogen environment, growing synthetic diamond in an environment rich in hydrogen, and using boron doping resulting in an increase in thermal conductivity.

In some embodiments, diamond regions having boron or other dopants implanted will have somewhat larger or smaller lattice structures than undoped diamond as a result of placement of the dopant within the diamond crystal structure. This can be of particular concern where a seed diamond is of a different composition than the synthetic grown diamond to be formed on the seed. The lattice mismatch between diamonds having different doping concentrations or between doped and undoped diamonds is controlled in some embodiments by implantation of ions selected to give the desired lattice structure. For example, a lightly boron-doped diamond region will have a lattice structure somewhat expanded relative to undoped diamond made from primarily carbon-12. Adding carbon-13 to the boron-doped diamond shrinks the lattice structure, and is used in some embodiments to eliminate the lattice mismatch between diamond layers in the diamond growth and separation process, or to control the lattice mismatch or strain between diamond layers such as between a seed diamond and a grown diamond layer.

The hydrogen atoms implanted to achieve separation are implanted under various conditions in various examples, but in one example are implanted at an angle of ten degrees relative to the diamond surface, and at a dose rate of approximately one microamp per square centimeter. The electrons are implanted with an energy of approximately 200 KeV, until the total dose of approximately ten to the seventeenth atoms per square centimeter are implanted into the diamond such as at layer 403 of FIG. 4. Varying the parameters of the hydrogen implant will vary the depth and density of the resulting hydrogen implant layer.

The resulting diamond assembly is heated in a non-oxidizing environment, such as in hydrogen or an inert gas, to an elevated temperature designed to cause the seed diamond region of the diamond assembly to separate at the area of hydrogen implantation. This separation occurs in one example at about 1200 degrees Celsius, while in other examples occurs within a range of 1100 to 2400 degrees Celsius. Once the seed and the grown diamond-seed diamond assembly separate, the grown diamond-see diamond assembly remains, as is shown in FIG. 5, with a portion of the grown diamond still attached to the mosaic of seed diamonds. The separation occurs spontaneously at elevated temperatures in some examples, but is caused by application of pressure across the hydrogen implant layer in other examples.

The examples shown here illustrate how a diamond can be formed using a process of growing a synthetic diamond on a mosaic of diamond seeds, and using ion implantation to separate the resulting diamond structure. Although specific embodiments have been illustrated and described herein, those of ordinary skill in the art will appreciate that a variety of arrangements which are calculated to achieve the same purpose may be substituted for the specific embodiments shown. This application is intended to cover any adaptations or variations of the invention. It is intended that this invention be limited only by the claims, and the full scope of equivalents thereof.

The invention claimed is:

1. A method of forming a diamond, comprising:
   growing a single crystal diamond on a plurality of seed diamonds;
   polishing the grown single crystal diamond;
   implanting the grown single crystal diamond with hydrogen ions through a polished surface; and
   separating the grown diamond from the plurality of seed diamonds at the layer of hydrogen ion implantation, thereby separating a single crystal grown diamond from a plurality of seed diamonds having a single crystal diamond layer grown thereon.

2. The method of claim 1, wherein growing the single crystal diamond comprises chemical vapor deposition.

3. The method of claim 1, wherein implanting the grown single crystal diamond comprises implantation of ions with a selected energy to form a separation layer within the grown single crystal diamond.

4. The method of claim 1, wherein separating the grown single crystal diamond from the plurality of seed diamonds comprises heating the grown single crystal diamond and seed diamonds.

5. The method of claim 1, wherein the grown diamond has a thermal conductivity greater than 2500 W/mK.

6. The method of claim 1, wherein growing includes growing single crystal diamond that is isotopically enhanced with carbon-12 such that the resulting carbon-13 concentration is less than 1%.

7. The method of claim 1, further comprising forming a plurality of different seed diamonds using the separated grown single crystal diamond.

8. The method of claim 1, further comprising repeating the implanting and the separating to form a plurality of different seed diamonds.

9. The method of claim 1, wherein separating includes separating by applying heat to the grown single crystal diamond.

10. The method of claim 1, wherein separating includes separating by applying at least one of physical pressure and light to the grown single crystal diamond.

11. The method of claim 1, wherein separating includes separating such that a layer of the grown single crystal diamond remains on the plurality of seed diamonds.

12. The method of claim 1, wherein growing includes growing a single crystal diamond with a concentration of boron atoms and a concentration of carbon-13 atoms adjusted in combination to control lattice mismatch between the grown single crystal diamond and the plurality of seed diamonds.

13. The method of claim 1, wherein separating includes separating within a region substantially free of graphite.

14. A method of forming a diamond, comprising:
   growing a single crystal diamond on a plurality of seed diamonds;
   polishing the grown single crystal diamond;
   implanting the grown single crystal diamond with hydrogen ions; and
   heating the grown single crystal diamond in a non-oxidizing environment such that the grown single crystal diamond separates at the layer of hydrogen ion implantation, thereby separating a single crystal grown diamond from a plurality of seed diamonds having a single crystal diamond layer grown thereon.

15. The method of claim 14, wherein heating includes heating between 1100° C. and 2400° C. in at least one of hydrogen and an inert gas environment.

16. The method of claim 14, further comprising applying at least one of light and physical pressure to at least one of the grown single crystal diamond and the plurality of seeds.

17. The method of claim 14, wherein growing includes growing a single crystal diamond having a concentration of boron atoms and a concentration of carbon-13 atoms adjusted in combination to reduce lattice strain in the gown single crystal diamond.

18. The method of claim 14, wherein growing includes growing a single crystal diamond having a concentration of boron atoms and a concentration of carbon-13 atoms to control lattice mismatch between the grown single crystal diamond and the plurality of seed diamonds.

19. The method of claim 14, further comprising repeating the implanting and the heating to form a plurality of different seed diamonds.

20. A synthetic diamond, comprising:
   a first single crystal diamond layer including a concentration of dopant atoms and concentration of carbon-13 atoms, the first the first single crystal diamond layer having a polished surface, wherein at least one of the concentration of dopant atoms and the concentration of carbon-13 atoms is to reduce strain energy in the first single crystal diamond layer;
   a first distribution of implanted hydrogen ions located within the first single crystal diamond layer adjoining the polished surface, the first distribution configured to cause the first single crystal diamond layer to separate into a plurality of single crystal diamond layers upon application of heat, each layer to include a substantially uniform planar surface, wherein one of the plurality of single crystal diamond layers is configured to remain attached to a plurality of seed diamonds; and
   wherein the one of the plurality of single crystal diamond layers is configured to receive a second distribution of hydrogen ions through an unpolished surface.

21. The diamond of claim 20, wherein the first single crystal diamond layer is formed for as a different single crystal seed diamond.

22. The diamond of claim 20, wherein the first single crystal diamond layer includes a concentration of boron atoms and a concentration of carbon-13 atoms adjusted in combination to minimize lattice mismatch between the first single crystal diamond layer and a seed diamond.

23. The diamond of claim 20, wherein the plurality of single crystal layers are to form a mosaic of single crystal diamonds having a cumulative surface area greater than a cumulative surface area of a plurality of seed diamonds on which the plurality of single crystal diamond layers are grown.

24. The diamond of claim 23, wherein the mosaic is to form a plurality of different seed diamonds.

25. The synthetic diamond of claim 20, wherein the first single crystal diamond layer has a thermal conductivity greater than 2500 W/mK.

26. The synthetic diamond of claim 20, wherein the first single crystal diamond layer is isotopically enhanced with carbon-12 such that the carbon-13 concentration is less than 1%.

27. The synthetic diamond of claim 20, wherein the first single crystal diamond layer has a nitrogen concentration of less than 50 ppm.

28. The synthetic diamond of claim 20, wherein each said surface has an area of at least 0.5 square centimeters.

29. A method of forming a synthetic diamond, comprising:
   growing a single crystal diamond on a plurality of seed diamonds;
   polishing a surface of the grown single crystal diamond;
   implanting a first concentration of hydrogen ions into the grown single crystal diamond through the polished surface;
   removing a first layer of the grown single crystal diamond from the plurality of seed diamonds, the first layer including the polished surface, the removing providing an unpolished surface associated with a remaining portion of the grown single crystal diamond attached to the plurality of seed diamonds;
   implanting a second concentration of hydrogen ions through the unpolished surface of the remaining portion; and
   removing a second layer of the grown single crystal diamond from the remaining portion.

30. The method of claim 29, further comprising repeating implanting a second concentration and removing a second layer.

31. The method of claim 30, further comprising forming a mosaic including a plurality of the second layers.

32. The method of claim 29, wherein growing includes growing a boron doped single crystal diamond with a concentration of carbon-13 atoms for reducing lattice mismatch between the single crystal diamond layer and the plurality of seed diamonds.

33. The method of claim 29, wherein growing includes growing a boron doped single crystal diamond concentration of with a concentration of carbon-13 atoms for reducing lattice strain in the single crystal diamond layer.

34. The method of claim 29, wherein the growing includes growing single crystal diamond having a thermal conductivity of greater than 2500 W/mK.

35. The method of claim 29, wherein the growing includes growing single crystal diamond having nitrogen concentration of less than 50 ppm.

36. The method of claim 29, wherein removing a first layer and removing a second layer includes removing by heating in a non-oxidizing environment.

* * * * *